United States Patent [19]

Chu

[11] Patent Number: 4,613,951

[45] Date of Patent: Sep. 23, 1986

[54] TIME INTERVAL MEASURING APPARATUS AND METHOD

[75] Inventor: David C. Chu, Woodside, Calif.

[73] Assignee: Hewlett-Packard Company, Palo Alto, Calif.

[21] Appl. No.: 659,815

[22] Filed: Oct. 11, 1984

[51] Int. Cl.[4] .................... G04F 10/00; H03K 5/159

[52] U.S. Cl. .................... 364/569; 364/575; 368/120; 375/114; 377/20

[58] Field of Search .............. 364/569, 571, 575, 734, 364/143, 604, 819, 824, 833; 328/129.1, 130.1; 375/110, 111, 113, 114, 118, 120; 368/107, 108, 120; 377/16, 19, 20

[56] References Cited

U.S. PATENT DOCUMENTS 4,468,746 8/1984 Davis .................... 364/569
4,564,918 1/1986 McNally et al. .................... 364/569

*Primary Examiner*—Felix D. Gruber
*Assistant Examiner*—G. Doudnikoff
*Attorney, Agent, or Firm*—Edward Y. Wong

[57] ABSTRACT

A time interval measuring apparatus is provided for measuring the time interval between two signals. The two signals are successively brought to synchronization by delaying one of the two signals as they pass through a series of time shift cells connected in tandem. These delays are accumulated in a register, and the total net delay which is required to bring the two signals into synchronization is indicative of the time interval between the two signals. This indication of the time interval between the two signals thus forms the time interval measurement thereof. It can be refined by increasing the number of time shift cells in tandem and using progressively finer delays.

7 Claims, 4 Drawing Figures

TIME INTERVAL MEASURING APPARATUS AND METHOD

BACKGROUND OF THE INVENTION

The present invention relates to an apparatus and a method for measuring time intervals. Usually time intervals are measured by counting clock pulses spaced apart in time by a known period for determining the time interval between a start event a stop event. As is commonly known, this approach allows for determination of the time interval only to a precision of plus or minus one count of the period of the clock pulses. To increase precision, it is desirable to measure the time elapsing between the start event and the occurrence of the first counted clock pulse (start time) as well as the time elapsing between the stop event and the occurrence of the last counted clock pulse (stop time).

To this end, known instruments use techniques to stretch the start and stop time intervals. According to a known method as disclosed in Hewlett-Packard Journal, Vol. 20, No. 9, May 1969, pp. 9–12, a capacitor is charged by a constant current during the time between the start or stop event and the first following clock pulse. Upon occurrence of the clock pulse, the time needed to discharge the capacitor with a lower current is measured by counting clock pulses. This time is proportional to the charging time interval by the factor of difference in currents and may be combined therewith to provide the time between the event and the first following clock pulse.

This method has the disadvantage that in measuring short time intervals, the time spent in stretching the start and stop time intervals may be considerably longer than the time interval between the first and last counted clock pulses. This disadvantage leads to a limitation of the rate at which the measurement can be repeated.

SUMMARY OF THE INVENTION

The present invention overcomes the prior art problem by performing a successive approximation of the time interval between a first and a second signal. This approximation produces the desired result in which time is logarithmically related to the measured time interval.

According to a preferred embodiment of the present invention, there is provided an apparatus for measuring a time interval comprising a plurality of time shift cells for approximating the time interval through accumulation of synchronizing time delays successively applied between first and second signals defining the time interval to substantially synchronize said first and second signals. Preferably the successive approximation is performed by determining the time sequence of occurrence of said first and second signals, delaying the early-occurring signal in relation to the late-occurring signal by a predetermined amount of synchronizing time delay and repeating this process with steadily decreasing synchronizing time delays applied between the signals until synchronization is reached to a predetermined accuracy. The time interval is then determined by accumulating the applied synchronizing time delays.

DETAILED DESCRIPTION OF THE INVENTION

Figure 1:
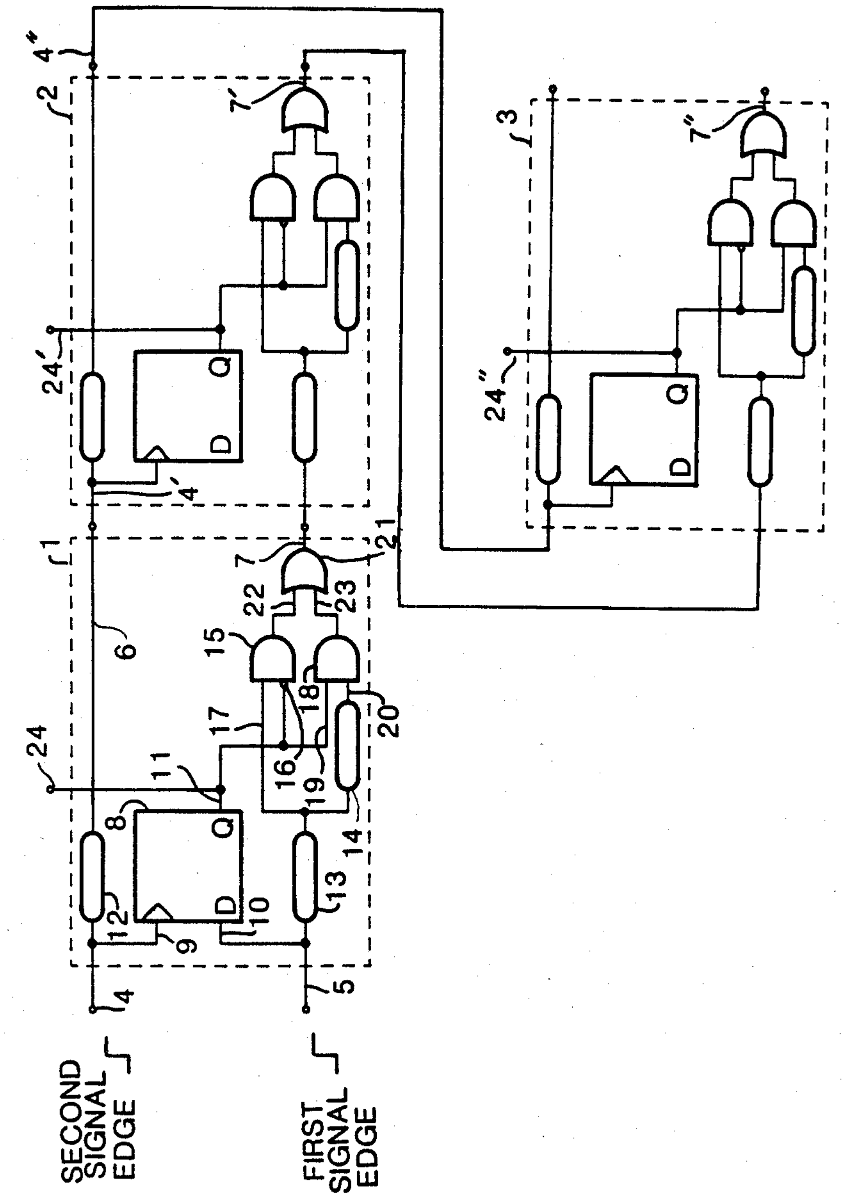
FIG. 1 shows a functional block diagram of a first embodiment of a time interval measuring apparatus according to the present invention comprising a number of time shift cells coupled in series.

As shown in FIG. 1, a preferred embodiment of the invention includes a plurality of similar time shift cells 1–3, each having first and second input ports 4, 5 and first and second output ports 6, 7. Coupled to the input ports 4, 5 is a bistable switching circuit 8 of the type commonly known as an edge-triggered, D-type flipflop. This flipflop circuit 8 has a clock input port 9 connected to the first input port 4, a data input port 10 connected to the second input port 5, and a flipflop output port 11 connected to an accumulator output port 24 of the time shift cell. The time interval to be measured is defined as the time interval between a first signal edge arriving at the second input port 5 and a second signal edge arriving at the first input port 4 of the first time shift cell 1. The flipflop circuit 8 is triggered by the signal edge arriving at the first input port 4; if the signal at the second input port 5 is in a first state (e.g. a low state) at the time of triggering, the triggering will set the signal at the flipflop output port 11 to a first value (a low value). If, conversely, a signal edge has arrived at the second input port 5 prior to the time of triggering so that the signal at the second input port 5 is in a second state (a high state) at the time of triggering, the signal at the flipflop output port 11 will be set to a second value (a high value). The signal at the output port 11 of the flipflop circuit 8 and at the accumulator output port 24 of the time shift cell 1, and similarly so for the other time shift cells 2, 3, thus gives an indication of the first-arriving one of two signal edges arriving at the first and second input ports 4, 5.

In each time shift cell 1–3, a first delay line 12 has a first end connected to the first input port 4 and a second end connected to the first output port 6. A second delay line 13 has a first end connected to the second input port 5 of the time shift cell and a second end connected to a first end of a third delay line 14. In an actual circuit, the delay lines 12–14 may be stripline transmission lines formed on a printed circuit board, coaxial or other transmission lines, charge-coupled device delay lines, monostable flipflops of a suitable type, or any other delaying device suitable for the range of time intervals to be measured by means of the time shift cells 1–3.

Each time shift cell 1–3 further includes a first AND gate 15 having an inverting input port 16 connected to the output port 11 of flipflop 8 and a non-inverting input port 17 connected to the first end of the third delay line 14. A second AND gate 18 has a first input port 19 connected to the output port 11 of the flipflop 8 and a second input port 20 connected to a second end of the third delay line 14. An OR gate 21 has a first input port 22 connected to an output port of the AND gate 15 and a second input port 23 connected to an output port of the AND gate 18. An output port of the OR gate 21 is connected to the second output port 7 of the time shift cell 1, 2 or 3.

The purpose of the delay lines 12–14 and the circuitry connected thereto is to provide a synchronizing time delay of $T/2^i$ between two signal edges appearing at the first and second input ports 4, 5 of the time shift cell 1. To this end, the first delay line 12 is chosen to provide a first time delay $D_i$, the second delay line 13 is chosen to provide a second time delay having a value of $D_i - T/2^i$, and the third delay line 14 is chosen to provide a third time delay having a value of $T/2^{i-1}$.

In these time delay relationships, T is the maximum time interval which can be measured by the series-coupled time shift cells and is chosen to suit the user's needs. For measuring start and stop time intervals as already described, the time interval T would be chosen to be the time between two consecutive clock pulses in the counting process.

The second delay line 13, which is equal to $D_i - T/2^i$, is a setup time delay chosen in such a way that the signal at the output port 11 of the flipflop 8 will have settled to its proper value upon triggering, will have propagated to the input ports of the AND gates 15, 18, and will have enabled one and disabled the other one of the AND gates 15, 18 before the signal edge appearing at the input port 5 of the time shift cell reaches the input ports 17, 20 of the AND gates 15, 18 by propagating through the second and third delay lines 13, 14.

The AND gates 15, 18 and the OR gate 21 introduce a propagation delay P into the signal path between the second input port 5 and the second output port 7 of the time shift cell 1, 2, or 3. In an actual circuit design, the first delay line 12 should therefore provide a delay of $D_i + P$ in order to compensate for the propagation delay. Since the propagation delay P will be dependent upon circuit types and layout, a certain amount of adjustment may be needed for a proper delay value for the first delay line 12. One means of adjustment may be to insert gates of the same type as the AND gate 18 and OR gate 21 into the first delay line 12. To simplify matters, however, the AND gates 15, 18 as well as the OR gate 21 will be treated as ideal gates having zero propagation delay in the following discussion.

The index i used in designating $D_i$ and in exponentiation is set equal to 1 in the first time shift cell 1 receiving at its input ports 4, 5 the original signal edges defining the time interval to be measured and is incremented by one for each succeeding time shift cell 2, 3.

As an example, the preferred embodiment is now described in terms of typical circuit values and delays.

A first rising signal edge arrives at the second input port 5 of the time shift cell 1 earlier in time than a second rising signal edge arriving at the first input port 4 by an amount of 0.575T. The second signal edge will trigger the flipflop 8, whose output port 11 attains a high state because of the presence of a high signal at the second input port 5 at the time of triggering. The high signal at the flipflop output port 11 will disable the first AND gate 15 and enable the second AND gate 18 to allow passage of the first rising signal edge from the second input port 5 through the second and third delay lines 13, 14, the second AND gate 18, and the OR gate 21 to the second output port 1 of the time shift cell 1. The amount of delay introduced for the first rising signal edge will thus be equal to $$D_1 - T/2 + T = D_1 + 0.5T.$$

The second rising signal edge will propagate from the first input port 4 of the time shift cell 1 through the first delay line 12 to the first output port 6, resulting in a delay of $D_1$. The time shift cell 1 thus delays the early-arriving signal edge by an amount of 0.5T with respect to the late-arriving signal edge to let the signal edges emerge from the output ports 7, 6 with their difference time reduced to 0.075T. Conversely, if the second signal edge appears at the first input port 4 of the time shift cell 1 earlier than the first signal edge appears at the second input port 5, the flipflop 8 will be triggered to disable the second AND gate 18 and to enable the first AND gate 15 so that the second signal edge will be delayed by $D_1$ while the first signal will be delayed by $$D_1 - T/2 = D_1 - 0.5T.$$

Again, the signal edges will emerge from the output ports 6, 7 of the time shift cell 1 with an amount 0.5T subtracted from their difference in time of appearance.

It should now be noted that the procedure will not lead to absolute synchronization of the first and second signal edges but to within predetermined limits. In particular, if the first and second signal edges appear at the input ports 4, 5 of the time shift cell 1 almost simultaneously, they will be spaced apart in time almost by an amount T/2 upon arrival at the first and second output ports 6, 7. However, the second time shift cell 2 in series, whose first and second input ports 4', 5' are coupled to the output ports 6, 7 of the first time shift cell 1, will introduce a synchronizing time delay of $T/2^2$ between the first and second signal edges to reduce their spacing substantially to T/4. The succeeding third time shift cell 3, whose input ports 4'', 5'' are coupled to first and second output ports 6', 7' of the second time shift cell 2, will further reduce the time spacing between the first and second signal edges substantially to T/8 at its output ports 6'', 7'', and so on for any additional succeeding time shift cells to substantially achieve synchronization of the first and second signal edges.

The time interval between the first and second signal edges may then be determined from the signals present at the accumulator output 24 of the first time shift cell 1 and all corresponding accumulator outputs 24', 24'' of the succeeding time shift cells 2, 3. Because the amount of synchronizing time delay introduced by the first time shift cell 1 is alway plus or minus $T/2^i$, the time interval can be calculated by a signed summation wherein the magnitude of each summand is equal to the amount of delay introduced by the respective time shift cell and the sign of the summand is positive if the accumulator output signal of the time shift cell is high and negative if the accumulator output signal is low. The measured value of time interval given by this summation is accurate to $T/2^k$, where k is the number of time shift cells coupled in series.

Figure 2:
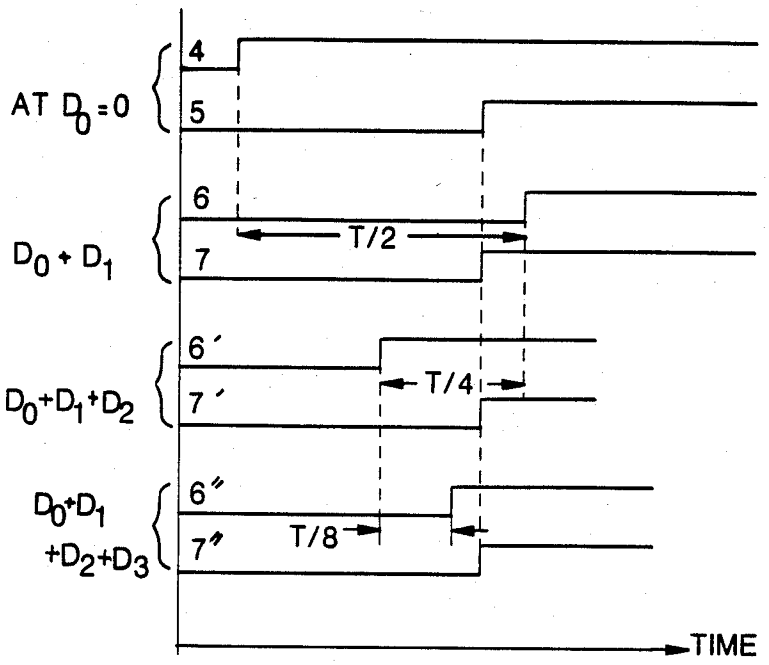
FIG. 2 illustrates, by way of example, the synchronization of first and second signals brought about by the apparatus shown in FIG. 1. Various timing diagrams of signals occurring in the apparatus of FIG. 1 are shown.

In FIG. 2, there is shown a number of timing diagrams illustrating the changes in the time relation between a first signal edge arriving at the second input port 5 and a second signal edge arriving at the first input port 4 of the first time shift cell 1 as these signal edges propagate through the time shift cells. In the timing diagrams the horizontal axis represents time while the vertical axis represents the state of signals at various points of the circuit in FIG. 1. The reference numbers are used to enumerate the timing diagrams shown in FIG. 2.

Diagrams 4 and 5 show the second signal edge arriving at the first input port 4 earlier in time than the first signal edge arrives at the second input port 5 by an amount 0.425T. The flipflop circuit 8 will be triggered to a low state because the first signal is in a low state at the time of triggering. Consequently, the signal edge at the first input port 4 will be delayed by 0.5T relative to the signal edge at the second input port 5. This delay causes the signal edges to appear in a reversed sequence at the first and second output ports 6, 7 with the first signal edge now leading the second signal edge by 0.075T as shown in FIG. 2. The second time shift cell 2 responds to the earlier arrival of the first signal edge at its input ports 4', 5' by delaying the first signal edge by an amount 0.25T relative to the second signal edge and indicating this by presenting a high signal at its accumulator output port 24'.

Upon arrival at the output ports 6', 7' of the second time shift cell 2, the second signal thus leads the first signal by an amount 0.175T as shown in FIG. 2. This sequence of arrival is detected by the third time shift cell 3, which responds to these signals by delaying the second signal by an amount 0.125T relative to the first signal and by setting its accumulator output properly to indicate the response. The signal edges then emerge at output ports 6", 7" of the third time shift cell 3 with the second signal edge leading the first signal edge by an amount 0.005T as shown in FIG. 2 at 6" and 7".

From the synchronizing time delays that are provided by the time shift cells 1-3 and the signals present at the accumulator output ports 24, 24', 24", the measured time interval will in this case be calculated as $$(-0.5+0.25-0.125)T=-0.3750T$$

according to the rules for calculation given above, while the true value is −0.425T.

Figure 3:
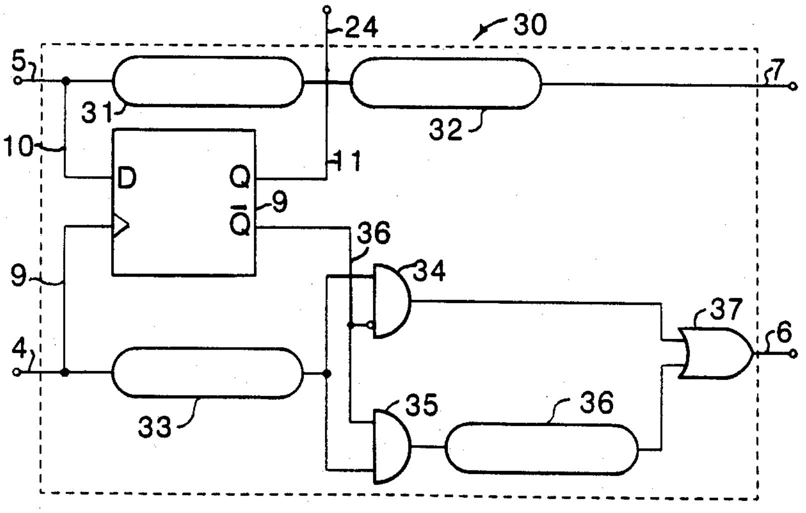
FIG. 3 shows an alternate embodiment of a time shift cell in accordance with the present invention.

In FIG. 3 an alternate embodiment of a time shift cell 30 for use in a series-coupled arrangement of time shift cells similar to the arrangement of FIG. 1 has first and second input ports 4, 5 and first and second output ports 6, 7. An edge-triggered D-type flipflop 8 has a clock input port 9 connected to the first input port 4, a data input port 10 connected to the second input port 5, and an output port 11 connected to an accumulator output port 24 of the time shift cell 30. The time interval to be measured is defined as the time interval between a first signal edge arriving at the second input port 5 and a second signal edge arriving at the first input port 4. The flipflop 8 is triggered by the signal edge arriving at the first input port 4; upon triggering, its output signal will be set according to the state of the signal at the second input port 5 as described above in connection with FIG. 1.

In FIG. 3, a first delay line 31 is connected to the second input port 5 and a second delay line 32 is connected to the first output port 7 with the first and second delay lines 31, 32 being connected one to the other. A third delay line 33 has a first end connected to the input port 4 of the time shift cell 30 and a second end connected to a non-inverting input port of a first AND gate 34 and an input port of a second AND gate 35. An inverting input of the first AND gate 34 and a second input port of the second AND gate 35 are connected to a complementary output port 36 of the flipflop 8. A fourth delay line 36 is connected between an output port of the second AND gate 35 and an input port of an OR gate 37. The OR gate 37 has an output port connected to the first output port 6 of the time shift cell 30. An output port of the first AND gate 34 is connected to a second input port of the OR gate 37.

The purpose of the delay lines 31, 32, 33, 36 and the circuitry connected thereto is to provide a synchronizing time delay of $T/2^i$ between two signal edges appearing at the first and second input ports 4, 5. In this embodiment, the first and third delay lines 31, 33 are chosen to provide equal delays, the second delay line 32 provides a delay of $T/2^i$, and the fourth delay line 36 provides a delay of $T/2^{i-1}$. In a physical circuit, an additional delay should be introduced between the second input port 5 and the first output port 6 of the time shift cell 30 to compensate for the propagation delay of the AND and OR gates 34, 35, 37 as has been explained in connection with FIG. 1. Depending on the signal present at output port 36 of the flipflop 8, the first and second AND gates 34, 35 will route the signal arriving from the first input port 4 in such a way that it is either delayed less or more than the signal propagating from the second input port 5 by $T/2^i$.

Figure 4:
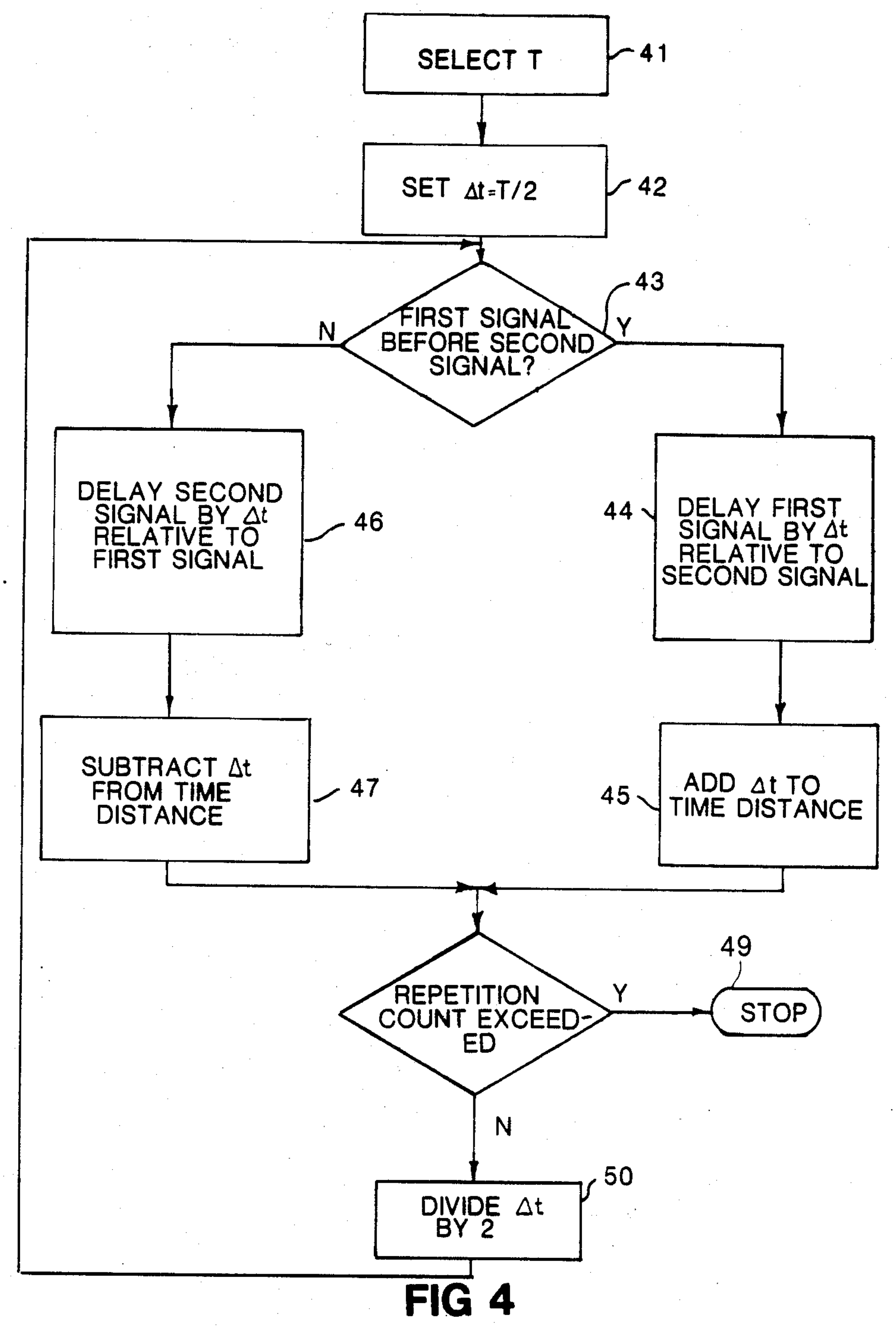
FIG. 4 shows a flow diagram of a procedure in accordance with the present invention for performing a successive approximation of a time interval.

The principle of operation of the series-coupled arrangement of time shift cells as shown in FIG. 1 may be illustrated in flow diagram form as shown in FIG. 4. After two preparatory steps 41, 42 wherein a unit of time interval T is selected and a first synchronizing time delay is set up, an iterative loop is repeated a predetermined number of times. Depending on the outcome of a detection step 43 for determining the time sequence of occurrence of first and second signals, a selected one of two loop branches is executed. In a first branch which includes further steps 44, 45, the first signal is delayed relative to the second signal by the synchronizing time delay, and the synchronizing time delay is added to a time interval count in response to an earlier occurrence of the first signal. Conversely, in a second branch which includes alternate further steps 46, 47, the second signal is delayed relative to the first signal by the synchronizing time delay, and the synchronizing time delay is subtracted from the time interval count in response to an earlier occurrence of the second signal.

Upon reaching a repetition count (step 48), the loop will be terminated (step 49). If the repetition count has not been reached, a new synchronizing time delay is selected by halving the current synchronizing time delay (step 50). Then the loop is repeated starting at the detection step 43.

Various modifications of the structure of the time shift cells herein disclosed may be made by appropriately designing switching circuitry coupled to suitable delay elements to provide the necessary delay difference between the signal paths of the first and second signals. A possible modification may even be the use of only one time shift cell having a delayed signal feedback from its output ports to its input ports. A further modification may be to introduce different synchronizing time delays by switching suitable delay elements into the separate feedback paths of each signal. The sequence of succeeding time shift cells would thus be replaced by a sequence of operations performed by one time shift cell having suitable feedback provisions from its output ports to its input ports.

I claim:

1. A time interval measuring apparatus having a plurality of time shift cells in tandem for measuring a time interval between two signals, each of said plurality of time shift cells comprising:

first and second input ports for receiving respectively first and second signals;

a time detection means coupled to said first and second input ports for producing an indicating output signal indicative of the sequence of arrival of said first and second signals at said first and second input ports respectively;

a time shift means coupled to said first and second input ports and to said time detection means for selectively providing a predetermined synchronizing time delay to the earlier one of said first and second signals in response to said indicating output signal and thereby providing new first and second signals, and first and second output ports for coupling said new first and second signals out.

2. The time interval measuring apparatus as in claim 1, wherein each of said time shift means comprises:

a first time delay means connected between said first input port and said first output port for delaying said first signal by a predetermined first time delay;

a switching means having a plurality of input ports coupled to said time detection means for selectively coupling one of said plurality of switching means input ports to a switching means output port in response to said indicating output signal; and a second time delay means connected between said second input port and one of said plurality of switching means input ports for delaying said second signal by a predetermined second time delay.

3. The time interval measuring apparatus as in claim 2, wherein:

said first time delay is larger than said second time delay by said synchronizing time delay; and one of said plurality of shifting means input ports has a shifting delay means connected thereto for imparting a shifting time delay having a value of twice said synchronizing time delay to a signal coupled thereto.

4. The time measuring apparatus as in claim 1, wherein a first time shift cell receives said first and second signals at its first and second input ports and provides said new first and second signals at its first and second output ports; and a second time shift cell coupled to said first time shift cell in tandem to receive said new first and second signals;

wherein said first time shift cell has a predetermined first synchronizing time delay between said first and second signals, and said second time shift cell has a predetermined second synchronizing time delay equalling half of said first synchronizing time delay.

5. A method of measuring the time interval between a first and a second signal comprising the steps of:

delaying an input signal comprising one of said first and second signals by a predetermined synchonizing time delay to provide a new input signal comprising one of said first and second signals, delayed;

repeating said step of delaying a predetermined number of times, each time delaying said new input signal by a succeeding predetermined synchronizing time delay to further synchronize said first and second signals;

treating said predetermined synchronizing time delays as positive values whenever said first signal is delayed and negative values whenever said second signal is delayed; and accumulating said predetermined synchronizing time delays in said predetermined number of times of repeating said step of delaying, said accumulated synchronizing time delays representing said time interval between said first and second signals.

6. The method as in claim 5, wherein said step of delaying comprises the steps of:

(a) selecting a unit of time interval;

(b) selecting a synchronizing time delay;

(c) determining the time sequence of occurrence of said first and second signals;

(d) providing a new first signal by delaying said first signal relative to said second signal by said synchronizing time delay and adding said synchronizing time delay to a cumulative time count only in response to an earlier occurrence of said first signal; and (e) providing a new second signal by delaying said second signal relative to said first signal by said synchronizing time delay and subtracting said synchronizing time delay from said cumulative time count only in response to an earlier occurrence of said second signal;

wherein said step of repeating comprises the steps of:

(f) modifying said synchronizing time delay to provide a new synchronizing time delay;

(g) replacing said first signal by said new first signal;

(h) replacing said second signal by said new second signal;

(i) replacing said synchronizing time delay by said new synchronizing time delay;

(j) repeating said steps (c) to (i) for a predetermined number of times; and wherein said step of accumulating comprises the step of combining said cumulative time count with said unit of time interval to provide the time interval between said first and second signals.

7. The method as in claim 6, wherein said step of modifying said synchronizing time delay consists of halving said synchronizing time delay.

* * * * *